(12) United States Patent
Cheng (10) Patent No.: US 10,720,575 B2
(45) Date of Patent: Jul. 21, 2020

(54) PHASE CHANGE MEMORY WITH GRADUAL RESISTANCE CHANGE

(71) Applicant: International Business Machines Corporation, Armonk, NY (US)

(72) Inventor: Kangguo Cheng, Schenectady, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/569,246

(22) Filed: Sep. 12, 2019

(65) Prior Publication Data

US 2020/0006646 A1    Jan. 2, 2020

Related U.S. Application Data

(62) Division of application No. 16/007,687, filed on Jun. 13, 2018, now Pat. No. 10,454,025.

(51) Int. Cl.
*H01L 45/00* (2006.01)

(52) U.S. Cl.
CPC .......... *H01L 45/06* (2013.01); *H01L 45/1233* (2013.01); *H01L 45/144* (2013.01); *H01L 45/165* (2013.01); *H01L 45/1616* (2013.01)

(58) Field of Classification Search
CPC .... H01L 45/06; H01L 45/1233; H01L 45/144
See application file for complete search history.

(56) References Cited

U.S. PATENT DOCUMENTS

| | | | |
|---|---|---|---|
| 6,141,241 A | 10/2000 | Ovshinsky et al. | |
| 7,233,017 B2 | 6/2007 | Yoon et al. | |
| 7,859,893 B2 | 12/2010 | Liu et al. | |
| 7,973,384 B2* | 7/2011 | Happ | H01L 45/06 257/296 |
| 8,084,799 B2* | 12/2011 | Happ | G11C 11/5678 257/296 |
| 8,203,872 B2 | 6/2012 | Parkinson | |
| 8,213,223 B2* | 7/2012 | Koh | G11C 11/56 365/148 |
| 8,456,940 B2 | 6/2013 | Hanzawa et al. | |
| 8,580,606 B2 | 11/2013 | Park et al. | |
| 8,759,808 B2* | 6/2014 | Nodin | H01L 45/06 257/1 |

(Continued)

OTHER PUBLICATIONS

List of IBM Patents or Patent Applications Treated As Related dated Sep. 12, 2019, 2 pages.

*Primary Examiner* — Allison Bernstein (74) *Attorney, Agent, or Firm* — Scully, Scott, Murphy & Presser, P.C.; L. Jeffrey Kelly, Esq.

(57) ABSTRACT

A phase change memory cell is provided that includes a phase change material-containing structure sandwiched between first and second electrodes. The phase change material-containing structure has a resistance that changes gradually, and thus may be used in analog or neuromorphic computing. The phase change material-containing structure may contain a plurality of phase change material pillars, wherein each phase change material pillar has a different phase change material composition. Alternatively, the phase change material-containing structure may contain a doped phase change material layer in which a dopant concentration decreases laterally inward from an outermost surface thereof.

18 Claims, 9 Drawing Sheets

(56) References Cited

U.S. PATENT DOCUMENTS

| | | |
|---|---|---|
| 9,058,978 B2 | 6/2015 | Koyama |
| 9,227,378 B2 | 1/2016 | Colombo et al. |
| 9,230,642 B2 | 1/2016 | Ryoo et al. |
| 9,337,421 B2 | 5/2016 | Chin et al. |

\* cited by examiner

FIG. 9A
(Invention)

PHASE CHANGE MEMORY WITH GRADUAL RESISTANCE CHANGE

BACKGROUND

The present application relates to a semiconductor structure and a method of forming the same. More particularly, the present application relates to a semiconductor structure including a phase change memory (PCM) cell in which the resistance across the cell changes gradually.

Phase change memory (PCM) is a type of non-volatile random access memory (NVRAM). A NVRAM retains its information when the power is turned off. This is in contrast to dynamic random access memory (DRAM) and static random access memory (SRAM), which both maintain data only for as long as power is applied.

A typically PCM includes a material stack of, and from bottom to top, a bottom electrode, a phase change memory material that exhibits a change in atomic order (from crystalline to amorphous or vice versa), and a top electrode. In such PCMs, the resistance changes abruptly. For some applications such as, for example, analog computing or neuromorphic applications, it is desired to have the resistance of a PCM changing gradually (or at least multiple bits) instead of simply binary resistance states (i.e., high-low resistances).

SUMMARY

A phase change memory cell is provided that includes a phase change material-containing structure sandwiched between first and second electrodes. The phase change material-containing structure has a resistance that changes gradually, and thus may be used in analog or neuromorphic computing. The phase change material-containing structure may contain a plurality of phase change material pillars, wherein each phase change material pillar has a different phase change material composition. Alternatively, the phase change material-containing structure may contain a doped phase change material layer in which a dopant concentration decreases laterally inward from an outermost surface thereof.

One aspect of the present application relates to a semiconductor structure. In one embodiment, the semiconductor structure includes a phase change memory cell located on a surface of a semiconductor substrate, wherein the phase change memory cell includes a material stack of, and from bottom to top, a first electrode, a phase change material-containing structure having a resistance that changes gradually, and laterally inward, from an outermost surface, and a second electrode.

In one embodiment, the phase change material-containing structure contains a plurality of phase change material pillars, wherein each phase change material pillar has a different phase change material composition. In another embodiment, the phase change material-containing structure includes a doped phase change material layer in which a dopant concentration of the doped phase change material layer decreases laterally inward from an outermost surface of the doped phase change material layer.

Another aspect of the present application relates to a method of forming a semiconductor structure. In one embodiment, the method includes forming a first electrode on a surface of a semiconductor substrate. A phase change material-containing structure is then provided on a surface of the first electrode. The phase change material-containing structure of this embodiment includes a plurality of phase change material pillars, wherein each phase change material pillar has a different phase change material composition. A top electrode is then formed on the phase change material-containing structure.

In another embodiment, the method includes providing a material stack of, and from bottom to top, a first electrode, a phase change material layer, and a second electrode. Next a dopant is introduced into the phase change material layer to provide a doped phase change material layer having a dopant concentration that decreases laterally inward from an outermost surface of the doped phase change material layer.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
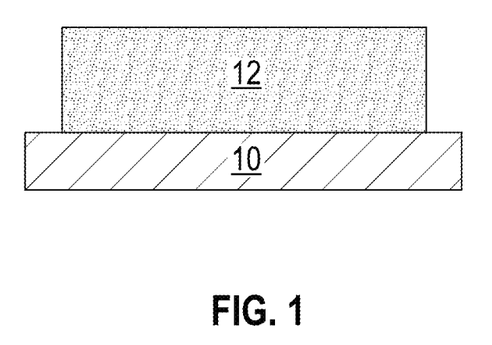
FIG. 1 is a cross sectional view of an exemplary semiconductor structure in accordance with the present application and during an early stage of fabrication, wherein the exemplary semiconductor structure includes a first electrode located on a surface of a semiconductor substrate.

Referring first to FIG. 1, there is illustrated an exemplary semiconductor structure in accordance with the present application and during an early stage of fabrication, wherein the exemplary semiconductor structure includes a first electrode 12 located on a surface of a semiconductor substrate 10.

The semiconductor substrate 10 that can be employed in the present application includes at least one semiconductor material that has semiconducting properties. Examples of semiconductor materials that can be used as the semiconductor substrate 10 include, for example, silicon (Si), a silicon germanium (SiGe) alloy, a silicon germanium carbide (SiGeC) alloy, germanium (Ge), III/V compound semiconductors or II/VI compound semiconductors. In one embodiment, the semiconductor substrate 10 may be a bulk semiconductor substrate. The term "bulk semiconductor substrate" denotes a substrate that is composed entirely of one or more semiconductor materials. In one example, the bulk semiconductor substrate is composed entirely of Si.

In some embodiments, the semiconductor substrate 10 is composed of a semiconductor-on-insulator substrate (SOI). A SOI substrate typically includes a handle substrate, an insulator layer and a topmost semiconductor material layer. In some embodiments, the handle substrate of the SOI may include a semiconductor material, as described above. In other embodiments, the handle substrate may be omitted, or the handle substrate may be composed of a conductive material and/or an insulator material. The insulator layer of the SOI substrate may include a crystalline or non-crystalline dielectric material. In one example, the insulator layer of the SOI substrate may be composed of silicon dioxide and/or boron nitride. The topmost semiconductor layer of the SOI substrate is composed of a semiconductor material, as defined above.

Although not shown, the semiconductor substrate 10 may be processed to include one or more semiconductor devices such as, for example, transistors, capacitors, diodes, resistors, conductive wires, and the like. The semiconductor substrate 10 may also include one or more isolation structures such as, for example, a trench isolation structure, formed therein.

As is illustrated in FIG. 1, first electrode 12 is formed on a surface of the semiconductor substrate 10. The first electrode 12 (or bottom electrode) includes a conductive metal and/or a conductive metal nitride. Examples of conductive materials that can be used as the first electrode 12 include, but are not limited to, titanium nitride (TiN), tungsten (W), tungsten nitride (WN), silver (Ag), platinum (Pt), palladium (Pd), or aluminum (Al). The first electrode 12 may include a single layered structure composed entirely of one conductive material or a multilayered structure containing at least two different conductive materials stacked one atop the other.

The first electrode 12 may by formed by first depositing a layer of the conductive metal and/or conductive metal nitride, and thereafter patterning the deposited layer of the conductive metal and/or conductive metal nitride. The depositing of the layer of the conductive metal and/or conductive metal nitride may include chemical vapor deposition (CVD), plasma enhanced chemical vapor deposition (PECVD), atomic layer deposition (ALD), sputtering or plating. The layer of the conductive metal and/or conductive metal nitride (and thus the first electrode 12) typically has a thickness from 10 nm to 200 nm. In one embodiment, the patterning of the layer of the conductive metal and/or conductive metal nitride may be performed by lithography and etching. Alternatively, any other well known patterning process may be used to provide the first electrode 12. After patterning, the first electrode 12 may have any desired width and/or length. In some embodiments, the first electrode 12, when viewed from a top down view, is circular in shape. Other shapes, such as, for example, square, rectangular, etc., are possible and can be employed in the present application.

In some embodiments, a selector (not shown) can be formed on the first electrode 12. When present, the selector includes diodes, threshold switching devices, etc. The selector can be formed utilizing any suitable process that is well known to those skilled in the art.

Figure 2:
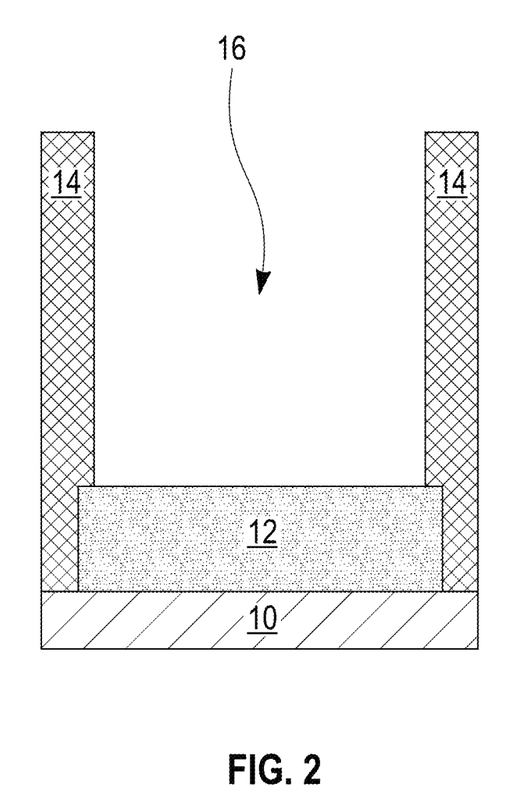
FIG. 2 is a cross sectional view of the exemplary semiconductor structure of FIG. 1 after forming an interlevel dielectric (ILD) material layer having an opening that physically exposes a surface of the first electrode.

Referring now to FIG. 2, there is illustrated the exemplary semiconductor structure of FIG. 1 after forming an interlevel dielectric (ILD) material layer 14 having an opening 16 that physically exposes a surface of the first electrode 12. The ILD material layer 14 is formed upon the entirety of the first electrode 12 and across the entirety of the semiconductor substrate 10.

The ILD material layer 14 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In one embodiment, the ILD material layer 14 can be formed utilizing a deposition process including, for example, CVD, PECVD, evaporation or spin-on coating. The thickness of the ILD material layer 14 may vary. A typically thickness from the ILD material layer 14 is from 50 nm to 250 nm. Although not shown, the ILD material layer 14 may comprise a multi-layered structure that includes at least two different dielectric materials stacked one atop the other such as, for example, silicon nitride and silicon dioxide.

After forming the ILD material layer 14, opening 16 is formed into the ILD material layer 14 by lithography and etching. The opening 16 physically exposes a portion of the first electrode 12. In some embodiments and as illustrated, the opening 16 does not physically expose an entirety of the first electrode 12. In such embodiments, the sidewall of the opening 16 lands on a topmost surface of the first electrode 12. In some embodiments (not shown), the opening 16 physically exposes an entirety of the first electrode such that the sidewall of the opening 16 is vertically aligned with the sidewall of the first electrode 12. The opening 16 is typically circular in shape. Other shapes (such as square, rectangular, etc.) are also conceived.

Figure 3:
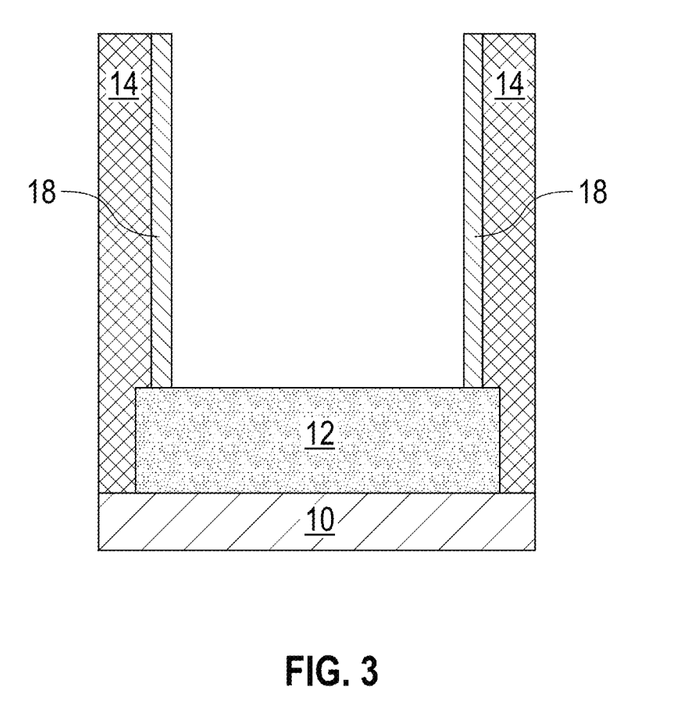
FIG. 3 is a cross sectional view of the exemplary semiconductor structure of FIG. 2 after forming a first dielectric spacer within the opening and along an inner sidewall of the ILD material.

Referring now to FIG. 3, there is illustrated the exemplary semiconductor structure of FIG. 2 after forming a first dielectric spacer 18 within the opening 16 and along an inner sidewall of the ILD material 14. In some embodiments, the formation of the first dielectric spacer 18 may be omitted. The first dielectric spacer 18 is composed of a spacer dielectric material that has a different dielectric material composition than the ILD material layer 14. Some examples of the spacer dielectric material that can be employed in the present application include, but are not limited to, silicon nitride (SiN), silicon carbide (SiC), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), silicon oxynitride (SiON), and combinations thereof. The dielectric spacer material may have a dielectric constant of less than about 7, or even less than about 5. First dielectric spacer 18 can be formed by any suitable technique such as, for example, deposition followed by a directional etch. Deposition may include, but is not limited to, ALD or CVD. The directional etch may include, but is not limited to, reactive ion etching (RIE).

When present, and in some embodiments, the first dielectric spacer 18 may have a topmost surface that is coplanar with a topmost surface of the ILD material layer 14. As is shown, the first dielectric spacer 18 has an outermost sidewall that is in direct physical contact with the physically exposed sidewall of the ILD material that is provided by opening 16. The first dielectric spacer 18 has a bottommost surface that directly contacts a portion of a topmost surface of the first electrode 12. The first dielectric spacer 18 may have a width, as measured from a first outermost sidewall to a second outermost sidewall, opposite the first outermost sidewall, from 2 nm to 10 nm. The width may also be referred to as a lateral thickness.

Figure 4:
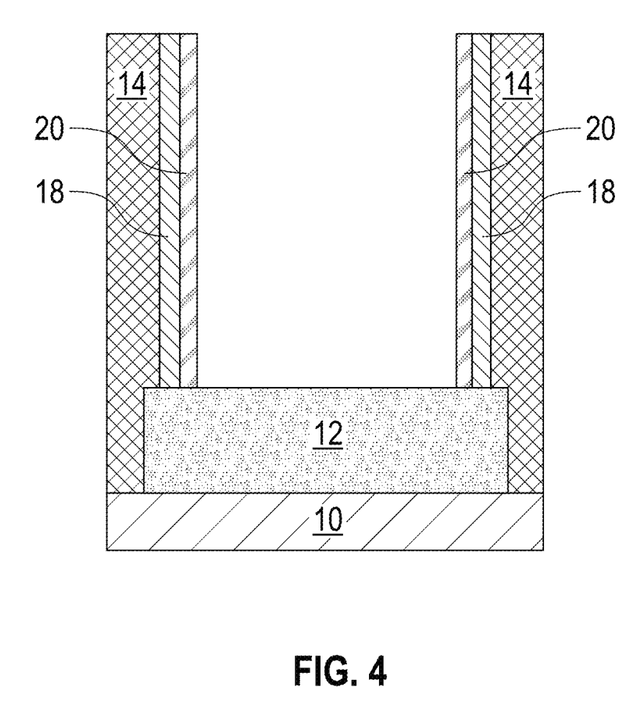
FIG. 4 is a cross sectional view of the exemplary semiconductor structure of FIG. 3 after forming a first phase change memory spacer composed of a first phase change material within the opening and along a sidewall of the first dielectric spacer.

Referring now to FIG. 4, there is illustrated the exemplary semiconductor structure of FIG. 3 after forming a first phase change memory spacer 20 composed of a first phase change material within the opening 16 and along a sidewall of the first dielectric spacer 18. In embodiments when, no first dielectric spacer 18 is formed, the first phase change memory spacer 20 is formed along the sidewall of the ILD material layer 14 provided by opening 16.

The first phase change material that provides the first phase change memory spacer 20 may be composed of a chalcogenide. Chalcogenides are comprised of an element from Group 16 (i.e., a chalcogen) of the Periodic Table of Elements and a more electropositive element. Examples of chalcogens that can be used to provide the first phase change material 28 include, but are not limited to, a GeSbTe alloy (GST), a SbTe alloy, or an InSe alloy. Other materials can also be used as the first phase change material so long as the other material can retain separate amorphous and crystalline states.

The first phase change memory spacer 20 may be formed by a deposition process such as, for example, CVD, PECVD or ALD, followed by performing a spacer etching, such as, for example, RIE. In some embodiments, the first phase change memory spacer 20 has a topmost surface that is coplanar with a topmost surface of the ILD material layer 14 and, if present, a topmost surface of the first dielectric spacer 18. The first phase change memory spacer 20 may have a width, as measured from a first outermost sidewall to a second outermost sidewall, opposite the first outermost sidewall, from 10 nm to 30 nm. The first phase change memory spacer 20 has a bottommost surface that is in direct physical contact with a portion of the topmost surface of the first electrode 12.

Figure 5:
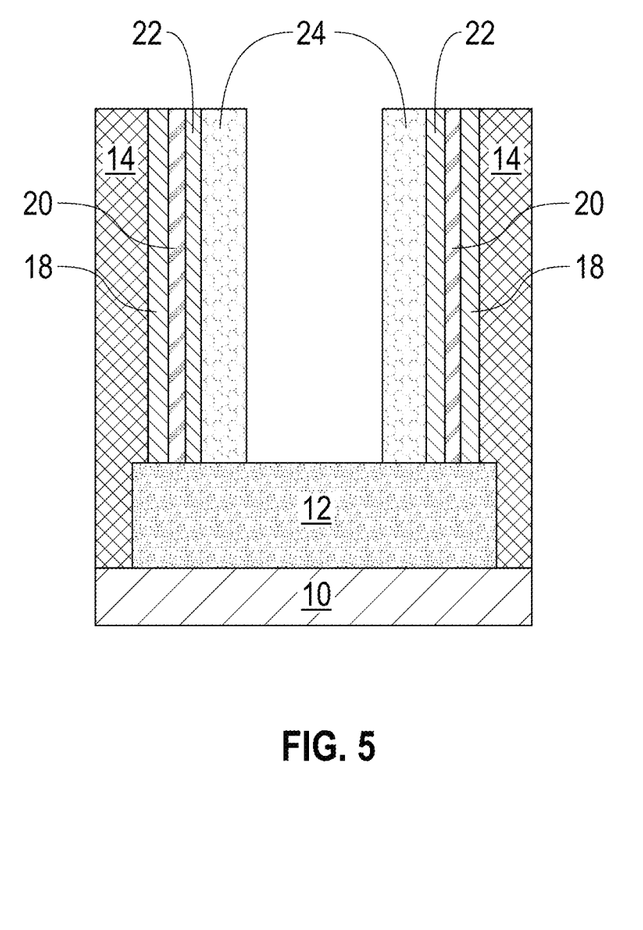
FIG. 5 is a cross sectional view of the exemplary semiconductor structure of FIG. 4 after forming a second dielectric spacer within the opening and along a sidewall of the first phase change memory spacer, and a second phase change memory spacer composed of a second phase change material, different from the first phase change material, in the opening and along a sidewall of the second dielectric spacer.

Referring now to FIG. 5, there is illustrated the exemplary semiconductor structure of FIG. 4 after forming a second dielectric spacer 22 within the opening 16 and along a sidewall of the first phase change memory spacer 20, and a second phase change memory spacer 24 composed of a second phase change material, different from the first phase change material, in the opening 16 and along a sidewall of the second dielectric spacer 22. In some embodiments, the second dielectric spacer 22 may be omitted. In such an embodiment, the second phase change memory spacer 24 would be formed along a sidewall of the first phase change memory spacer 20. Each of the second dielectric spacer 22 and the second phase change memory spacer 24 has a bottommost surface that is in direct physical contact with a portion of the topmost surface of the first electrode 12. It should be noted that, although it is possible to omit the formation of the dielectric spacers, such dielectric spacers can be beneficial to prevent mixing of the various phase change material spacers during SET and RESET operations.

When present, the second dielectric spacer 22 may include one of the spacer dielectric materials mentioned above for the first dielectric spacer 18. In one embodiment, the spacer dielectric material that provides the second dielectric spacer 22 is the same as the spacer dielectric material that provides the first dielectric spacer 18. In another embodiment, the spacer dielectric material that provides the second dielectric spacer 22 is different from the spacer dielectric material that provides the first dielectric spacer 18. The second dielectric spacer 22 may be formed utilizing the processes mentioned above for forming the first dielectric spacer 18. The second dielectric spacer 20 may have a width, as measured from a first outermost sidewall to a second outermost sidewall, opposite the first outermost sidewall, from 2 nm to 10 nm.

The second phase change material that provides the second phase change memory spacer 24 may include one of the materials, i.e., chalcogenides, mentioned above for the first phase change material that provides the first phase change memory spacer 20 provided that the second phase change material is compositionally different from the first phase change memory material that provides the first phase change memory spacer 20. The second phase change memory spacer 24 may be formed utilizing the technique mentioned above for providing the first phase change memory spacer 20. In some embodiments, the second phase change memory spacer 24 may have a width, as measured from a first outermost sidewall to a second outermost sidewall, opposite the first outermost sidewall, that is substantially the same (i.e., ±5%) as the width of the first phase change memory spacer 20. In other embodiments, the second phase change memory spacer 24 may have a width, as measured from a first outermost sidewall to a second outermost sidewall, opposite the first outermost sidewall, that is different from the width of the first phase change memory spacer 20. In one embodiment, the width of the second phase change memory spacer 24 is greater than the width of the first phase change memory spacer 20. In another embodiment, the width of the second phase change memory spacer 24 is less than the width of the first phase change memory spacer 20.

Figure 6:
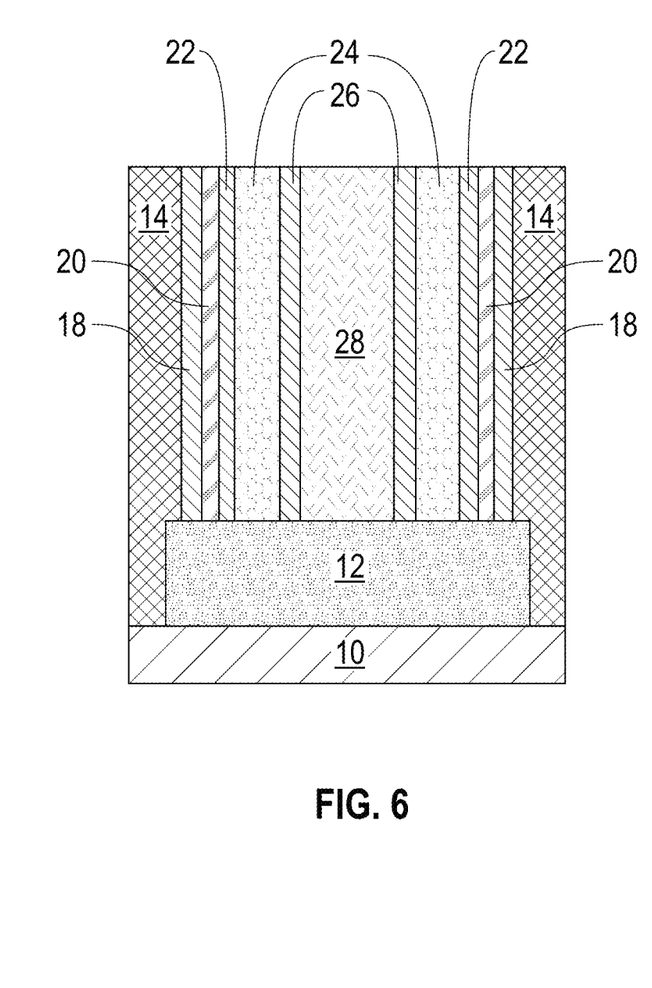
FIG. 6 is a cross sectional view of the exemplary semiconductor structure of FIG. 5 after forming a third dielectric spacer within the opening and along a sidewall of the second phase change memory spacer, and a third phase change memory spacer composed of a third phase change material, different from both the first and second phase change materials, in the opening and along a sidewall of the third dielectric spacer.

Referring now to FIG. 6, there is illustrated the exemplary semiconductor structure of FIG. 5 after forming a third dielectric spacer 26 within the opening 16 and along a sidewall of the second phase change memory spacer 24, and a third phase change memory spacer 28 composed of a third phase change material, different from both the first and second phase change materials, in the opening 16 and along a sidewall of the third dielectric spacer 24. In some embodiments, the third dielectric spacer 26 is omitted. In such an embodiment, the third phase change memory spacer 28 is formed along a sidewall of the second phase change memory spacer 24. Each of the third dielectric spacer 26 and the third phase change memory spacer 28 has a bottommost surface that is in direct physical contact with a portion of the topmost surface of the first electrode 12.

When present, the third dielectric spacer 26 may include one of the spacer dielectric materials mentioned above for the first dielectric spacer 18. In one embodiment, the spacer dielectric material that provides the third dielectric spacer 26 is the same as the spacer dielectric material that provides the first dielectric spacer 18. In another embodiment, the spacer dielectric material that provides the third dielectric spacer 26 is different from the spacer dielectric material that provides the first dielectric spacer 18. The third dielectric spacer 26 may be formed utilizing the processes mentioned above for forming the first dielectric spacer 18. The third dielectric spacer 26 may have a width, as measured from a first outermost sidewall to a second outermost sidewall, opposite the first outermost sidewall, from 3 nm to 10 nm.

The third phase change material that provides the third phase change memory spacer 28 may include one of the materials, i.e., chalcogenides, mentioned above for the first phase change material that provides the first phase change memory spacer 20 provided that the third phase change material is compositionally different from the first and second phase change memory materials that provide the first phase change memory spacer 20 and the second phase change memory spacer 24, respectively. The third phase change memory spacer 28 may be formed utilizing the technique mentioned above for providing the first phase change memory spacer 20. In some embodiments, the third phase change memory spacer 28 may have a width, as measured from a first outermost sidewall to a second outermost sidewall, opposite the first outermost sidewall, that is substantially the same (i.e., ±5%) as the width of the first phase change memory spacer 20 and/or the second phase change memory spacer 24. In other embodiments, the third phase change memory spacer 28 may have a width, as measured from a first outermost sidewall to a second outermost sidewall, opposite the first outermost sidewall, that is different from the width of the first phase change memory spacer 20 and/or the second phase change memory spacer 24. In one embodiment, the width of the third phase change memory spacer 28 is greater than the width of the first phase change memory spacer 20 and/or the second phase change memory spacer 24. In another embodiment, the width of the third phase change memory spacer 28 is less than the width of the first phase change memory spacer 20 and/or the second phase change memory spacer 24.

Although the present application described and illustrates the formation of three optional dielectric spacers (18, 22, 26) and three phase change material spacers (20, 24, 28), the processing of forming an optional dielectric spacer and a phase change material spacer having a different phase change composition than the other phase change material spacers may continue, any number of times, until the entire opening 16 is filled. In some embodiments, only two phase change material spacers each having a different phase change material composition can be formed into the opening 16.

Figure 7:
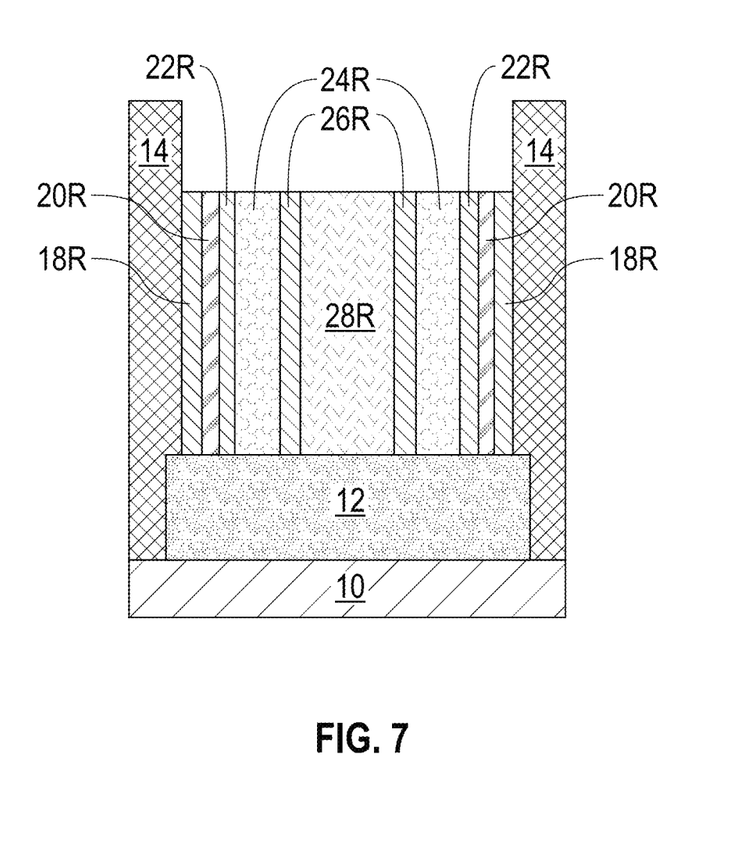
FIG. 7 is a cross sectional view of the exemplary semiconductor structure of FIG. 6 after recessing the first dielectric spacer, the first phase change memory spacer, the second dielectric spacer, the second phase change memory spacer, the third dielectric spacer and the third phase change memory spacer.

Referring now to FIG. 7, there is illustrated the exemplary semiconductor structure of FIG. 6 after recessing the first dielectric spacer 18, the first phase change memory spacer 20, the second dielectric spacer 22, the second phase change memory spacer 24, the third dielectric spacer 26 and the third phase change memory spacer 28. The recessing may be performed utilizing a recess etching process that is selective in recessing the dielectric spacers and the phase change memory spacers. The recessed dielectric spacers and recessed phase change memory spacers have a topmost surface that is below the topmost surface of the ILD material layer 14, and coplanar with each other.

The remaining portion of the first dielectric spacer 18 after recessing may be referred to as a first dielectric pillar 18R, the remaining portion of the first phase change material spacer 20 after recessing may be referred to as a first phase change memory pillar 20R, the remaining portion of the second dielectric spacer 22 after recessing may be referred to as a second dielectric pillar 22R, the remaining portion of the second phase change material spacer 24 after recessing may be referred to as a recessed second phase change memory pillar 24R, the remaining portion of the third dielectric spacer 26 after recessing may be referred to as a recessed third dielectric pillar 26R, the remaining portion of the third phase change material spacer 28 after recessing may be referred to as a recessed third phase change memory pillar 28R.

Collectively, the first phase change memory pillar 20R, the second phase change memory pillar 24R, and the third phase change memory pillar 28R and, if present, the first, second and third dielectric pillars (18R, 22R, 26R) may be referred to a phase change memory material-containing structure having a gradually changing resistance. Again, the number of phase change material pillars may vary and is not limited to three; at least two phase change material pillars having different phase change material compositions are required. In some embodiments, the change in resistance of the phase change memory material-containing structure increases from the outermost phase change material pillar (e.g., first phase change pillar 20R) inward to the middle recessed phase change material pillar (e.g., third phase change material pillar 28R). In other embodiments, the change in resistance of phase change memory material-containing structure decreases from the outermost phase change material pillar (e.g., first phase change material 20R) inward to the middle phase change material pillar (e.g., third phase change material pillar 28R).

In some embodiments, each phase change material pillar (e.g., the first phase change memory pillar 20R, the second phase change memory pillar 24R, and the third phase change memory pillar 28R) may have substantially a same width, i.e., lateral thickness. In other embodiments, each phase change material pillar (e.g., the first phase change memory pillar 20R, the second phase change memory pillar 24R, and the third phase change memory pillar 28R) may have different widths, i.e., laterally thicknesses. In one examples, the width of each phase change material pillar (e.g., the first phase change memory pillar 20R, the second phase change memory pillar 24R, and the third phase change memory pillar 28R) increases from the outermost phase change material pillar inward to the middle phase change material pillar. For example, and in the illustrated embodiment, the first phase change material pillar 20R may have a first width, the second phase change material pillar 24R may have a second width, and the third phase change material pillar 28R may have a third width, wherein the third width is greater than the second width, and the second width is greater than the first width.

In one example, each of the phase change material pillars (e.g., 20R, 24R and 28R) of the phase change memory material-containing structure is composed of a GeSbTe alloy (GST) in which the atomic concentration of germanium in each of the pillars is different. In one embodiment, the outermost phase change material pillar (e.g., first phase change pillar 20R) has the greatest atomic germanium concentration and the atomic germanium content of each remaining phase change material pillar decreases successively inward from the outermost phase change material pillar.

Figure 8A:
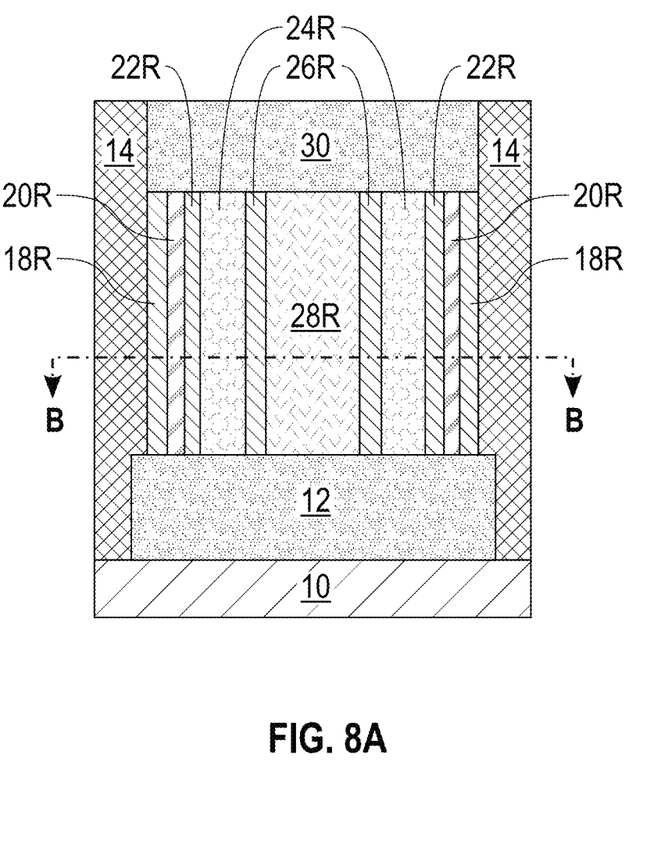
FIG. 8A is a cross sectional view of the exemplary semiconductor structure of FIG. 7 after forming a second electrode in contact with each of the recessed first dielectric spacer, the recessed first phase change memory spacer, the recessed second dielectric spacer, the recessed second phase change memory spacer, the recessed third dielectric spacer and the recessed third phase change memory spacer.
Figure 8B:
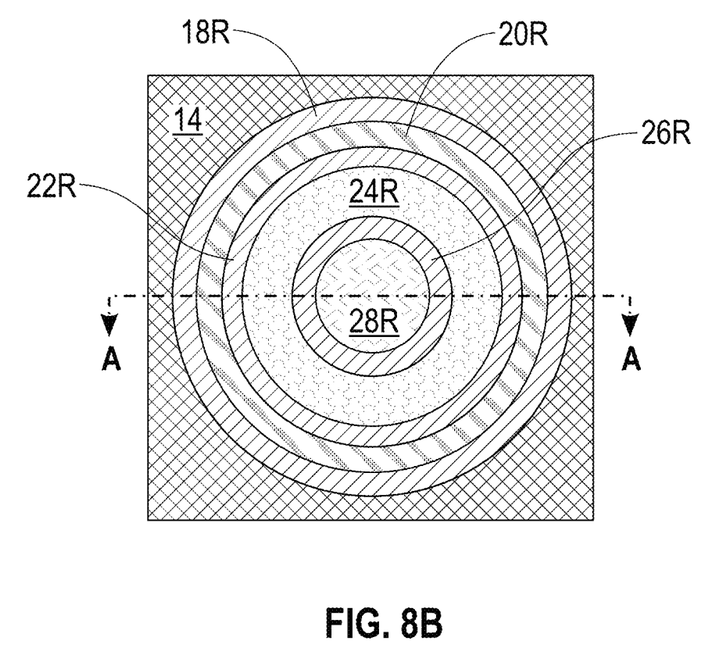
FIG. 8B is a top down view through line B-B of FIG. 8A.

Referring now to FIGS. 8A-8B, there are illustrated the exemplary semiconductor structure of FIG. 7 after forming a second electrode 30 in contact with a topmost surface of the phase change memory material-containing structure (e.g., each of the first dielectric pillar 18R, the first phase change memory pillar 20R, the second dielectric pillar 22R, the second phase change memory pillar 24R, the third dielectric pillar 26R and the third phase change memory pillar 28R). The second electrode 30 has an outermost sidewall that contacts a physically exposed upper sidewall portion of the ILD material layer 14 in opening 16.

The second electrode 30 (i.e., top electrode) may be composed of one of the conductive metals or metal nitrides mentioned above for the first electrode 12. The second electrode 30 may be formed by utilizing one of the deposition processes mentioned above for forming the first electrode 12. In some embodiments, a planarization process such as, for example, chemical mechanical polishing (CMP) and/or grinding, may follow the deposition of the conductive metal or metal nitride that provides the second electrode 30. Thus, and in some embodiments, the second electrode 30 may have a topmost surface that is coplanar with a topmost surface of the ILD material layer 14.

Figure 8C:
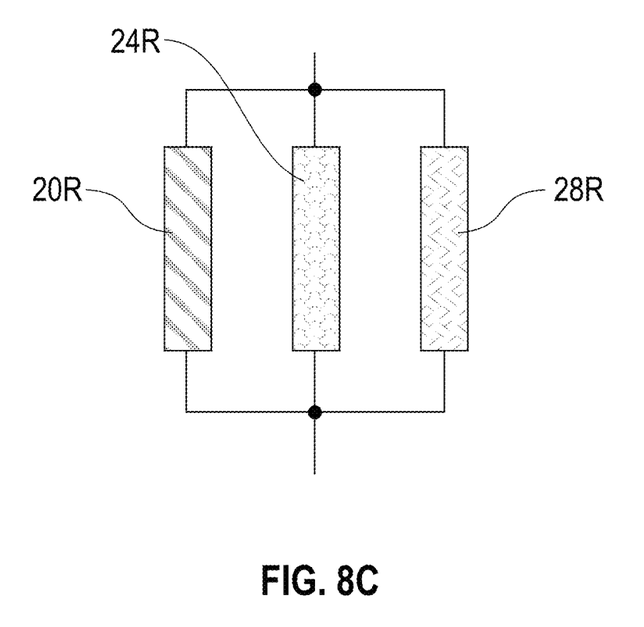
FIG. 8C is a diagram illustrating the equivalent circuit of the exemplary structure shown in FIGS. 8A-8B.

Collectively, the first and second electrodes 12, 30 and the phase change memory material-containing structure (containing the phase change material pillars and, if present, the dielectric pillars) provide a PCM cell of the present application. In this embodiment, the PCM cell contains multiple concentric phase change memory pillars that have different phase change material compositions. Each phase change memory pillar thus has a different melting point (and thus different resistances) associated therewith. In this embodiment, the inventive PCM cell has a digitized change in resistance from one pillar to the other. As is shown in FIG. 8C and for this embodiment, the inventive PCM cell's resistance is the equivalent to the total resistance of each phase change memory pillar in parallel.

Since each phase change memory pillar has a different phase change material composition and thus different programming capability, the SET and RESET resistances of the inventive PCM cell changes gradually instead of abruptly. This is clearly evident in FIG. 9A which is a schematic diagram illustrating the Set and Reset operations in accordance with an embodiment of the present application and for PCM cell having three GeSbT pillars (e.g., 20R, 24R and 28R) in which the germanium content of each phase change material pillar decreases from the outermost GeSbT pillar (i.e., first phase change material pillar 20R) inward to the middle GeSbT pillar (i.e., third phase change material pillar 28R). For the SET operation (amorphous to crystalline), when the inventive PCM cell is subjected to multiple sequence pulses, the crystallization first occurs at the center phase change material pillar (i.e., the third phase change material pillar 28R) and then gradually propagates to outward to the outermost phase change material pillar (i.e., the first phase change material pillar 20R). For the RESET operation (crystalline to amorphous), the amorphization occurs first at the middle phase change material pillar (i.e., the third phase change material pillar 28R) that has the lowest melting point; this pillar will have a high resistance state. However, the total resistance does not change abruptly because the other two phase change material pillars (i.e., 24R and 20R) are still in a low resistance state.

Figure 9A:
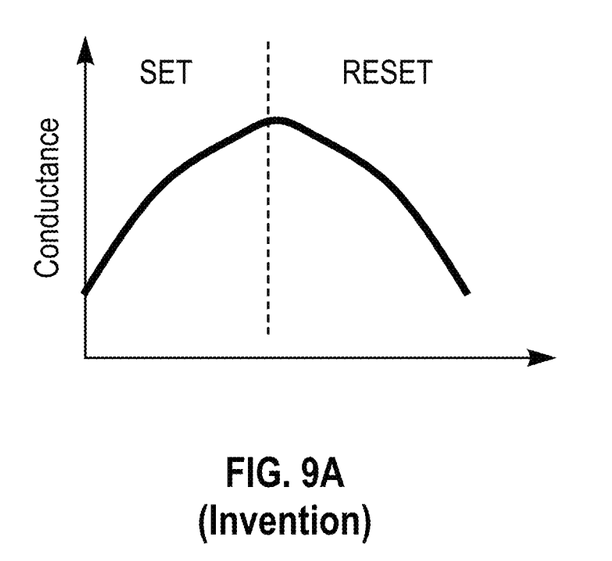
FIG. 9A is a schematic diagram illustrating the Set and Reset Operations in accordance with an embodiment of the present application.
Figure 9B:
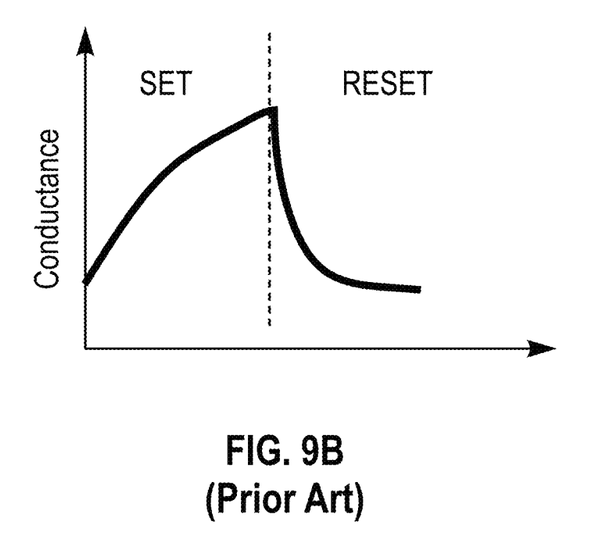
FIG. 9B is a schematic diagram illustrating the Set and Reset Operations in accordance with the prior art.

For comparison, FIG. 9B shows a schematic diagram illustrating the Set and Reset Operations in accordance with a prior art PCM cell that contains a single phase material layer sandwiched between a bottom and top electrode. In the prior art cell, an abrupt change is observed.

Figure 10:
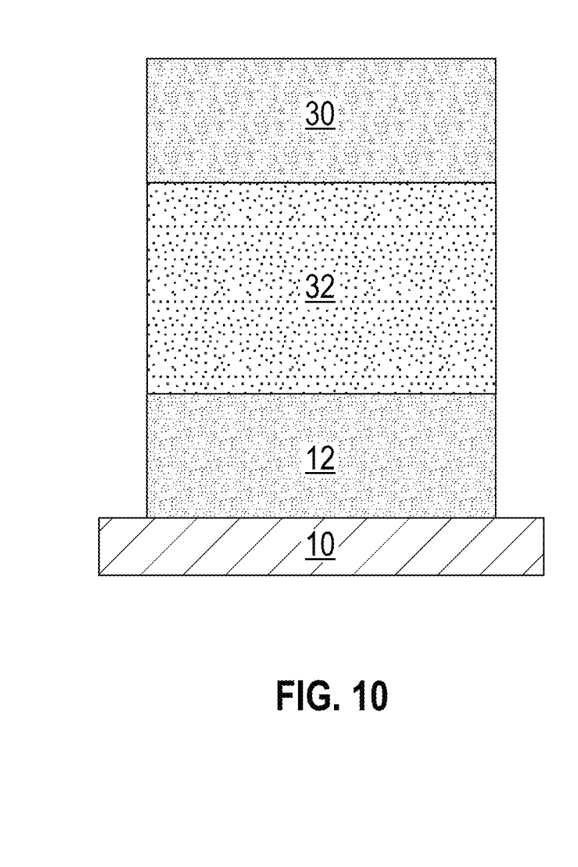
FIG. 10 is a cross sectional view of another exemplary semiconductor structure in accordance with the present application and during an early stage of fabrication, wherein the another exemplary semiconductor structure includes a first electrode located on a surface of a semiconductor substrate, a phase change material layer located on the first electrode, and a second electrode located on the phase change material layer.

Referring now to FIG. 10, there is shown another exemplary semiconductor structure in accordance with the present application and during an early stage of fabrication, wherein the another exemplary semiconductor structure includes a first electrode 12 located on a surface of a semiconductor substrate 10, a phase change material layer 32 located on the first electrode 12, and a second electrode 30 located on the phase change material layer 32.

In this embodiment of the present application, the semiconductor substrate 10, the first electrode 12 and the second electrode 30 include materials as discussed in the previous embodiment of the present application. Phase change material layer 32 is a single layered phase change material. In one embodiment, the single layered phase change material that provides phase change material layer 32 may be composed of a chalcogenide. As described above, chalcogenides are comprised of an element from Group 16 (i.e., a chalcogen) of the Periodic Table of Elements and a more electropositive element. Examples of chalcogens that can be used to provide the phase change material layer 32 include, but are not limited to, a GeSbTe alloy (GST), a SbTe alloy, or an InSe alloy. In one example, the phase change material layer 32 is composed of a GeSbTe alloy having a germanium concentration from 5 atomic percent to 10 atomic percent. Other materials can also be used as the phase change material layer 32 so long as the other material can retain separate amorphous and crystalline states.

The phase change material layer 32 may be formed by a deposition process such as, for example, CVD, PECVD or atomic layer deposition (ALD. The phase change material layer 32 has a bottommost surface the is in direct physical contact with a portion of the topmost surface of the first electrode 12, and a topmost surface that is directly physical constant with the second electrode.

The exemplary structure shown in FIG. 10 can be formed by sequential deposition of blanket layers of a first conductive metal or conductive metal nitride layer, a phase change material, and a second conductive metal or conductive metal nitride layer, and, thereafter, patterning the sequentially deposited blanket layers by lithography and etching. The remaining portion of the first conductive metal or conductive metal nitride layer provides the first electrode 12, the remaining portion of the phase change material provides the phase change material layer 32, and the remaining portion of the second conductive metal or conductive metal nitride provides the second electrode 30. The structure including the first electrode 12, the phase change material layer 32, and the second electrode 30 shown in FIG. 10, when viewed from a top down view, is circular in shape. Other shapes as mentioned above are possible and can be used in the present application.

Figure 11:
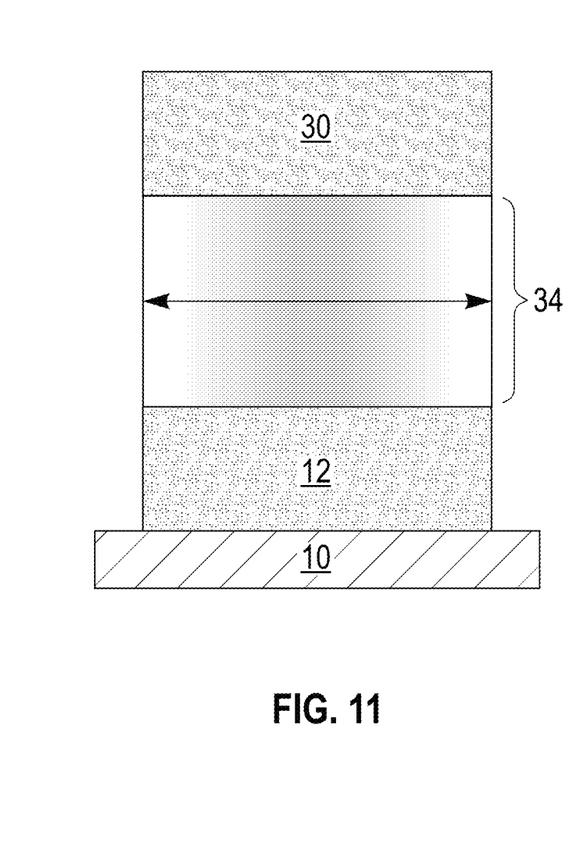
FIG. 11 is a cross sectional view of the exemplary semiconductor structure of FIG. 10 after introducing a dopant into the phase change material layer to provide a doped phase change material layer having a dopant concentration that decreases gradually inward.

Referring now to FIG. 11, there is illustrated the exemplary semiconductor structure of FIG. 10 after introducing a dopant into the phase change material layer 32 to provide a doped phase change material layer 34 having a gradient dopant concentration that decreases gradually inward. That is, doped phase change material layer 34 has a higher dopant concentration at the outermost sidewall thereof that decreases inward to a middle portion of the doped phase change material layer 34. Doped phase change material layer 34 may be referred to as a phase change memory material-containing structure having a gradually changing resistance.

The dopant that is introduced into the phase change material layer 32 is dependent on the type of phase change material employed and is selected such that the added dopant changes the melting point (and thus the resistance) of the phase change material layer 32. In one example, and when a GeST alloy is employed, germanium (Ge) is used as the dopant. In another embodiment, and when a SbTe alloy is employed, tin (Sn) can be used as the dopant. In yet another embodiment, and when InSe is employed, germanium (Ge) may be used as the dopant. The dopant can be introduced into the phase change material layer 32 using a plasma sidewall doping process, an angled ion implantation process, or depositing a dopant source material laterally adjacent to, and on the sidewalls of, the phase change material layer 32 followed by a thermal anneal to drive dopants from the dopant source material into phase change material layer 32. The dopant source material is typically removed after the thermal anneal has been performed.

Collectively, the first and second electrodes 12, 30 and the phase change memory material-containing structure (i.e., doped phase change material layer 34) provide a PCM cell of the present application. The inventive PCM cell of this embodiment of the present application exhibits similar SET and RESET operational characteristics as shown in FIG. 9A of the present application.

Figure 12:
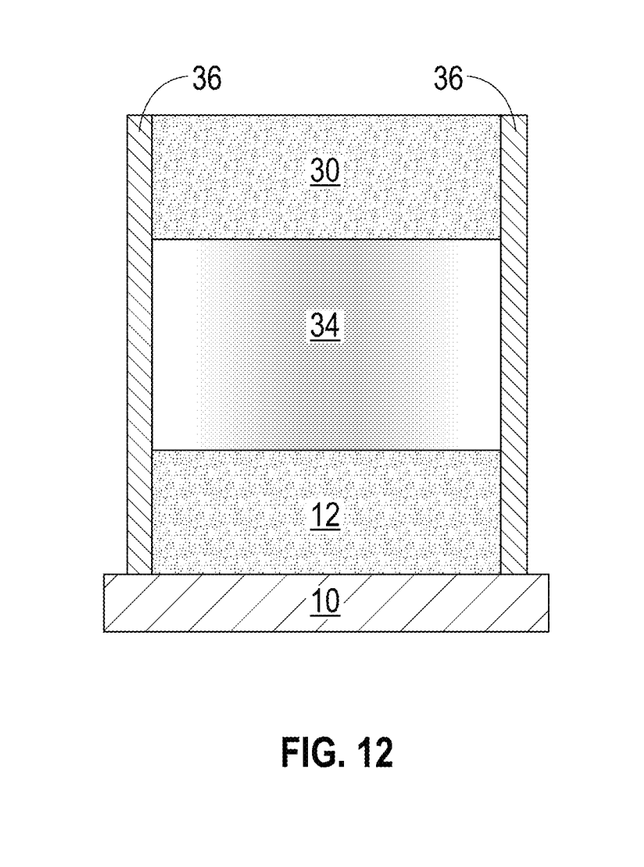
FIG. 12 is a cross sectional view of the exemplary semiconductor structure of FIG. 11 after forming a dielectric spacer.

Referring now to FIG. 12, there is illustrated the exemplary semiconductor structure of FIG. 11 after forming a dielectric spacer 36. In some embodiments, dielectric spacer 36 formation may be omitted. Dielectric spacer 36 may include one of the dielectric spacer materials mentioned above for the first dielectric spacer 18. Dielectric spacer 36 may be formed by deposition of the dielectric spacer material followed by a spacer etch. When present, dielectric spacer 36 has a topmost surface that is coplanar with a topmost surface of the second electrode 30 and a sidewall that is presently along the entirety of the outermost sidewall of the PCM cell (12/34/30).

Figure 13A:
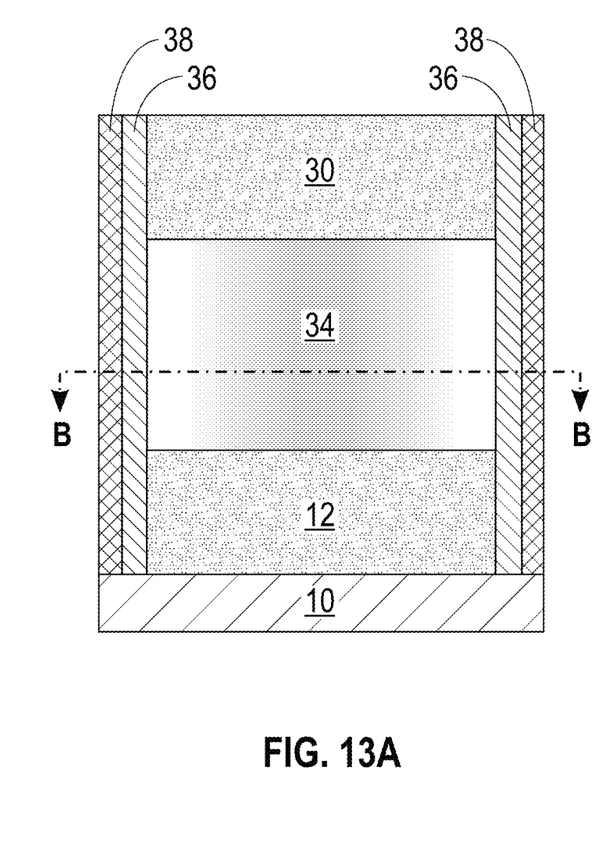
FIG. 13A is a cross sectional view of the exemplary semiconductor structure after forming an ILD material layer.
Figure 13B:
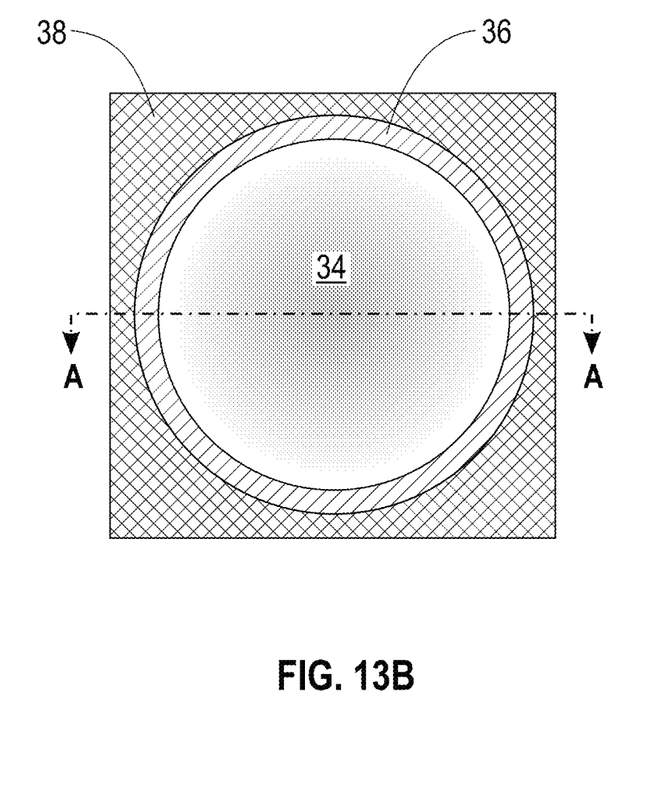
FIG. 13B is a top down view through line B-B of FIG. 13A.

Referring FIGS. 13A-13B, there are shown the exemplary semiconductor structure after forming an ILD material layer 38. The ILD material layer 38 may include one of the dielectric materials mentioned above for ILD material layer 14. The ILD material layer 38 may be formed by a deposition process. In some embodiments, and after deposition of the dielectric material that provides the ILD material layer, a planariazation process, such as, for example, chemical mechanical polishing and/or grinding is employed. In the illustrated embodiment, the ILD material layer 38 has a topmost surface that is coplanar with a topmost of the second electrode 30.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a phase change memory cell located on a surface of a semiconductor substrate, wherein the phase change memory cell comprises a material stack of, and from bottom to top, a first electrode, a phase change material-containing structure having a resistance that changes gradually, and laterally inward, from an outermost surface, and a second electrode, wherein the phase change material-containing structure comprises a doped phase change material layer in which a dopant concentration of the doped phase change material layer decreases laterally inward from an outermost surface of the doped phase change material layer.

2. The semiconductor structure of claim 1, wherein the first electrode has an outermost sidewall that is vertically aligned to an outermost sidewall of both the phase change material-containing structure and the second electrode.

3. The semiconductor structure of claim 1, wherein the doped phase change material layer is a single layered material.

4. The semiconductor structure of claim 3, wherein the doped phase change material layer is composed of a doped chalcogenide.

5. The semiconductor structure of claim 1, wherein the doped phase change material layer comprises a germanium doped GeSbTe alloy.

6. The semiconductor structure of claim 1, wherein the doped phase change material layer comprises a tin doped SbTe alloy.

7. The semiconductor structure of claim 1, wherein the doped phase change material layer comprises a germanium doped InSe alloy.

8. The semiconductor structure of claim 1, further comprising a dielectric spacer located along an entire sidewall of the phase change memory cell.

9. The semiconductor structure of claim 8, further comprising an interlevel dielectric material layer laterally adjacent to the dielectric spacer.

10. The semiconductor structure of claim 9, wherein the interlevel dielectric material layer has a topmost surface that is coplanar with a topmost surface of the dielectric spacer and a topmost surface of the second electrode.

11. The semiconductor structure of claim 1, further comprising an interlevel dielectric material layer located along an entire sidewall of the phase change memory cell and located on the semiconductor substrate.

12. The semiconductor structure of claim 11, wherein the interlevel dielectric material layer has a topmost surface that is coplanar with a topmost surface of the second electrode.

13. The semiconductor structure of claim 1, wherein a bottommost surface of the first electrode is located directly on a topmost surface of the semiconductor substrate.

14. The semiconductor structure of claim 1, wherein the first electrode is composed of titanium nitride, tungsten, tungsten nitride, silicon, platinum, palladium or aluminum.

15. The semiconductor structure of claim 1, wherein the second electrode is composed of titanium nitride, tungsten, tungsten nitride, silver, platinum, palladium or aluminum.

16. The semiconductor structure of claim 1, wherein the first electrode is composed of a first conductive material and the second electrode is composed of a second conductive material, wherein the first and second conductive materials are compositionally the same.

17. The semiconductor structure of claim 1, wherein the first electrode is composed of a first conductive material and the second electrode is composed of a second conductive material, wherein the first and second conductive materials are compositionally different.

18. The semiconductor structure of claim 1, wherein a first surface of the phase change material-containing structure directly contacts a surface of the first electrode, and a second surface of the phase change material-containing structure, opposite the first surface, directly contacts a surface of the second electrode.

* * * * *